United States Patent
Wang et al.

(10) Patent No.: US 6,382,307 B1
(45) Date of Patent: May 7, 2002

(54) DEVICE FOR FORMING HEAT DISSIPATING FIN SET

(75) Inventors: Tony Wang; Quan Lee, both of Sanchung (TW)

(73) Assignee: Chaun-Choung Technology Corp., Taipei Hsien (TW)

( * ) Notice: Subject to any disclaimer, the term of this patent is extended or adjusted under 35 U.S.C. 154(b) by 0 days.

(21) Appl. No.: 09/834,969

(22) Filed: Apr. 16, 2001

(51) Int. Cl.[7] ................................................. F28F 7/00
(52) U.S. Cl. ............................... 165/80.3; 165/104.33; 165/185; 361/697; 361/700; 361/709; 257/706; 257/715
(58) Field of Search ................................ 165/80.3, 185, 165/104.33, 104.26; 361/697, 700, 709; 257/706, 715

(56) References Cited

U.S. PATENT DOCUMENTS

| | | | | |
|---|---|---|---|---|
| 1,841,380 A | * | 1/1932 | Phelps et al. | 165/183 |
| 2,585,912 A | * | 2/1952 | Buschow et al. | 165/183 |
| 2,959,402 A | * | 11/1960 | Edwards | 165/183 |
| 3,141,999 A | * | 7/1964 | Schneider | 165/185 |
| 3,246,213 A | * | 4/1966 | Hannan | 165/185 |
| 4,648,443 A | * | 3/1987 | Szucs et al. | 165/183 |
| 5,509,465 A | * | 4/1996 | Lai | 165/80.3 |
| 5,947,192 A | * | 9/1999 | Kuo | 165/80.3 |
| 6,006,827 A | * | 12/1999 | Lu | 165/104.33 |
| 6,289,975 B2 | * | 9/2001 | Kuo | 165/80.3 |

* cited by examiner

*Primary Examiner*—Henry Bennett
*Assistant Examiner*—Terrell McKinnon
(74) *Attorney, Agent, or Firm*—Rosenberg, Klein & Lee

(57) ABSTRACT

A device for forming a heat dissipating fin set comprises a heat tube made of copper, and at least one heat dissipating fin set made of metal. Each fin in the heat dissipating fin set having a though hole. One side of the though hole is extended with a combining portion. A slender hole with a smaller diameter is formed on an upper edge of the though hole; the heat dissipating fin set being engaged to the heat tube through the though holes. A metal wire selected from silver, tin or copper is arranged into the slender holes at an upper edge of fin in the heat dissipating fin set; and then the heat tube and heat dissipating fin set are combined by heat melting. Thereby, a device for forming a heat dissipating fin set with a heat resistor without any interface and having a preferred heat conductance is formed.

3 Claims, 5 Drawing Sheets

DEVICE FOR FORMING HEAT DISSIPATING FIN SET

FIELD OF THE INVENTION

The present invention relates to a device for forming a heat dissipating fin set, and especially to a forming structure in that the heat dissipating fin set and heat tube are tightly combined together without any interface heat resistance, and thus it has a preferred heat conductance.

BACKGROUND OF THE INVENTION

In the prior art, heat tubes are used. Interiors of the heat tubes are formed with proper wick structures. By the capillary function of the wick structure, the working fluid in the heat tube may be transferred easily. The heat tube can be connected to a central processing unit (CPU) of a computer mainframe, or other high temperature chip, or other heat emitting elements so that the heat interior the heat emitting element can be guided out through the heat tube. Therefore the heat emitting element (for example, a CPU) may work normally.

Referring to FIG. 1, an exploded perspective view of a prior art device for forming a heat dissipating fin set and heat tube is illustrated. The device for forming a heat dissipating fin set and heat tube is formed by a heat tube 1a and a heat dissipating fin set 2. Each fin 2a is engage to the heat tube 1a through a through hole 3a and a combining portion 4a. In order to enhance the heat dissipating effect of the heat tube 1a, a plurality of fins 2a can be engaged to the heat tube 1a for increasing the heat dissipating area. Since the heat dissipating fin set 2a is fixed to the heat tube 1a by tightly matching, or a heat conductive glue is used to combine the heat dissipating fin set 2a and heat tube 1a, the tightness therebetween is bad and the interface heat resistance will increase. Therefore the heat transferring efficiency is not good.

SUMMARY OF THE INVENTION

Accordingly, the primary object of the present invention is to provide a device for forming a heat dissipating fin set. A heat tube and a heat dissipating fin set are made of copper which has good extension ability and heat conductance. The extension ability and heat conductance of copper are better than those of aluminum. Furthermore, the heat resistance of copper is better than aluminum. The heat tube and heat dissipating fin set are formed integrally by melting silver, tin or copper. This combination way is better than the prior art in that the heat dissipating fin set is firmly secured to the heat tube. In the present invention, the heat tube is almost completely engaged to and heat dissipating fin set. Moreover, in the present invention, the heat dissipating fin set and heat tube are not glued together through heat conductive glue. It has no heat resistance and thus has a preferred heat conductance.

The various objects and advantages of the present invention will be more readily understood from the following detailed description when read in conjunction with the appended drawing.

DETAILED DESCRIPTION OF THE PREFERRED EMBODIMENTS

In order that those skilled in the art can further understand the present invention, a description will be described in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
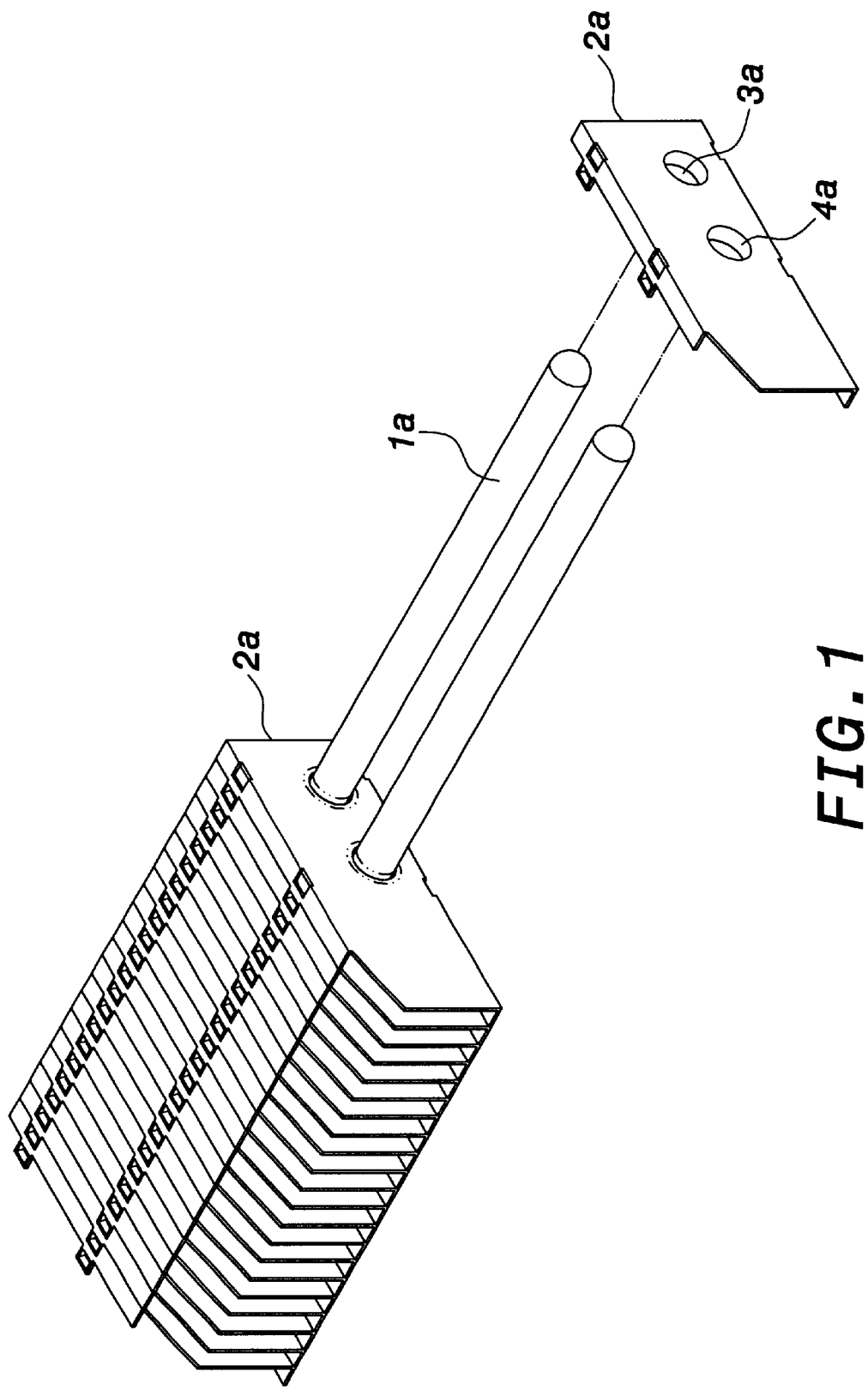
FIG. 1 is an exploded perspective view of the device for forming a heat dissipating fin set and a heat tube in the prior art.
Figure 2:
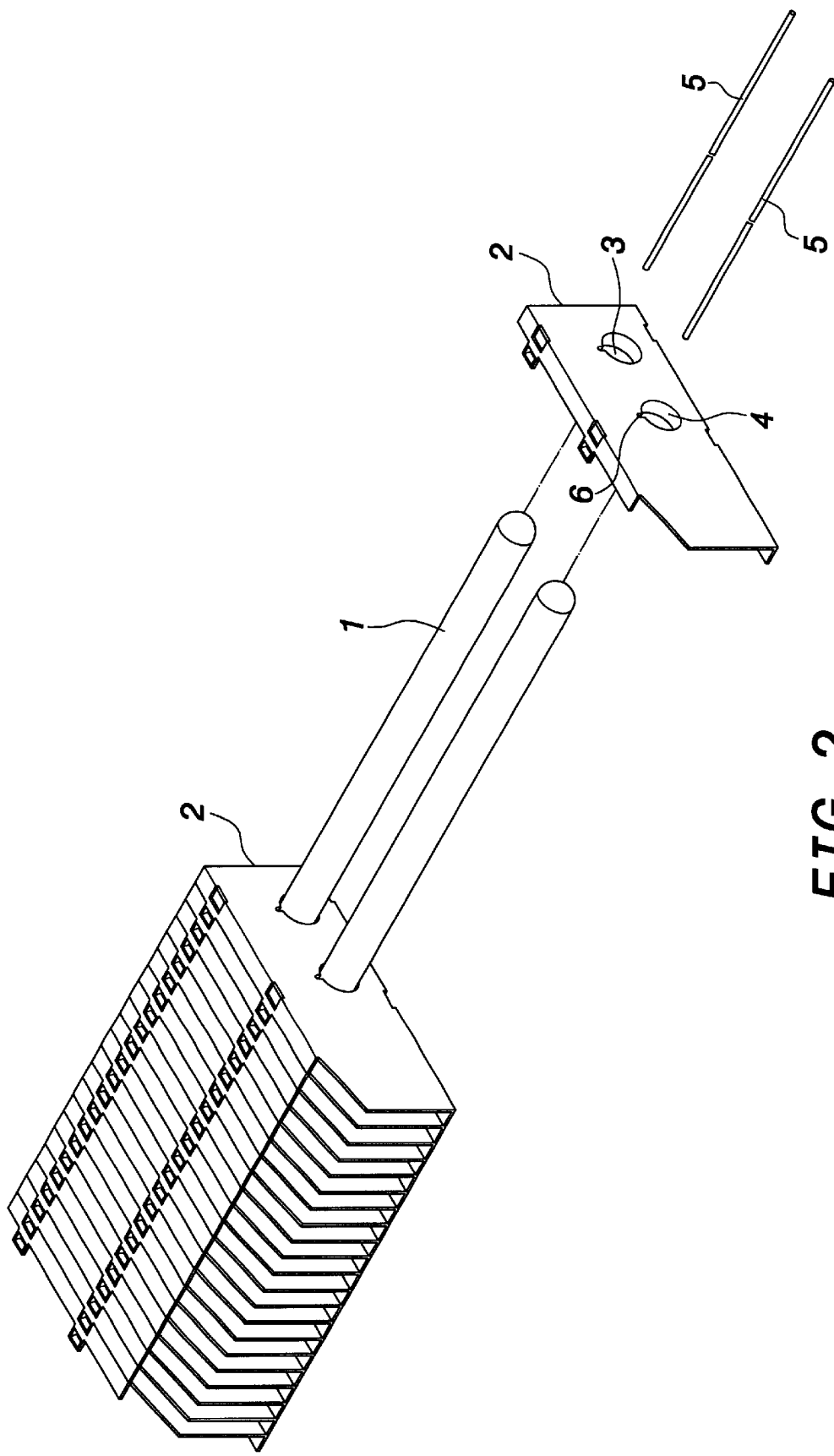
FIG. 2 is an exploded perspective view of the present invention.
Figure 3:
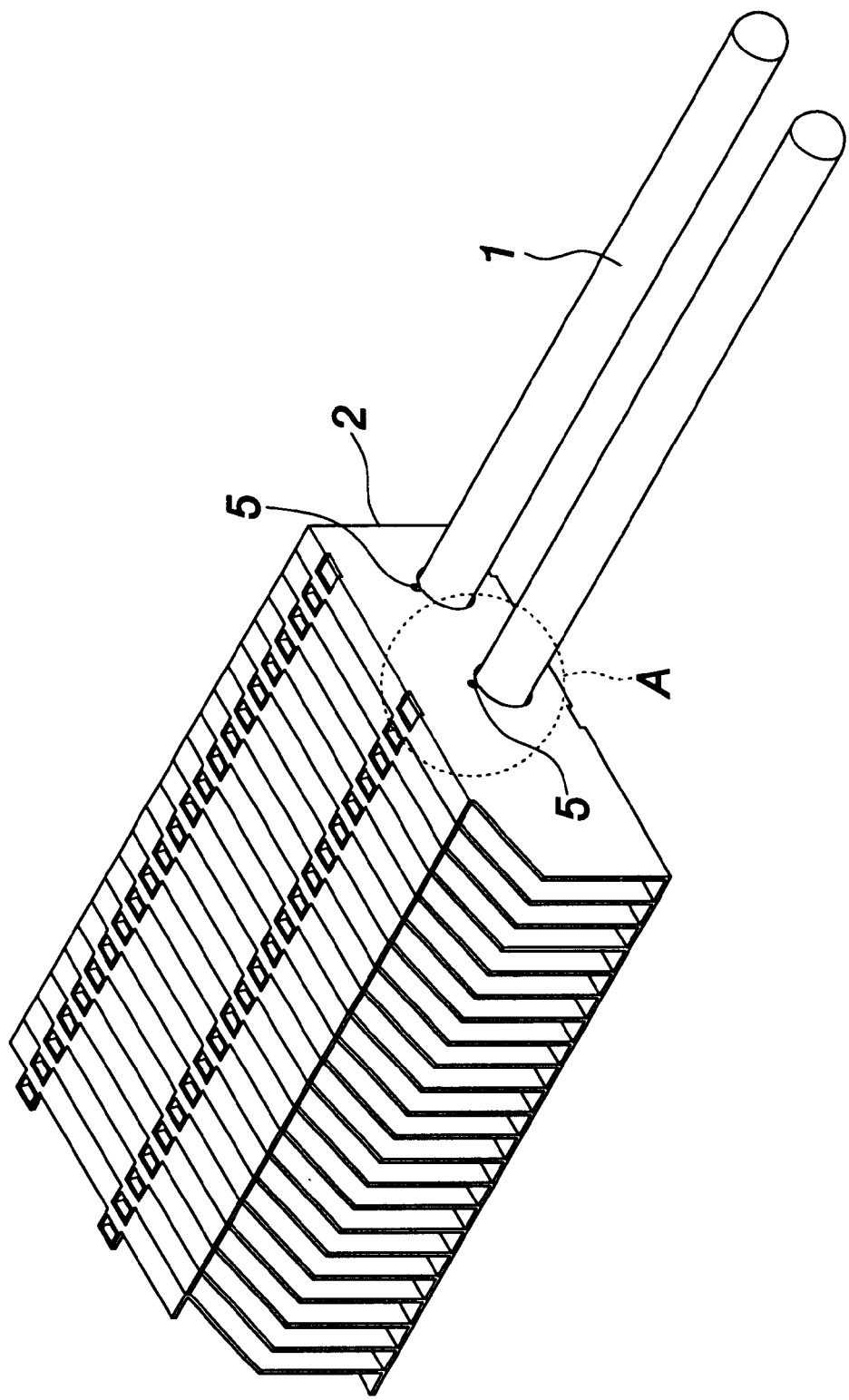
FIG. 3 is an assembled perspective view of the present invention.
Figure 4:
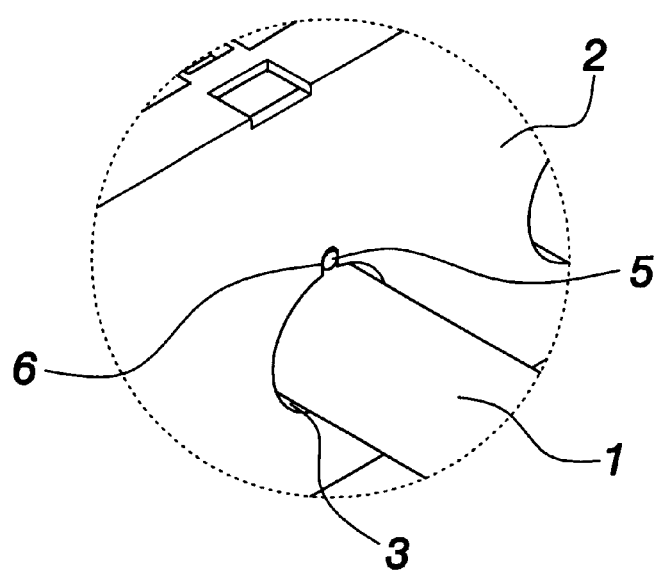
FIG. 4 is an enlarged view of the A part of FIG. 3 in the present invention.
Figure 4A:
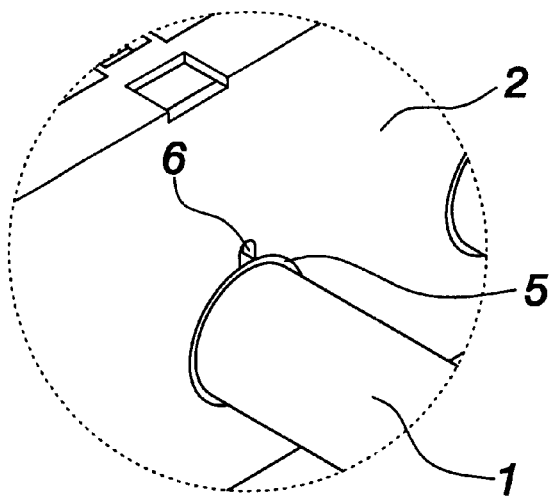
FIG. 4A is a schematic view showing the metal wire in FIG. 4 of the present invention Has melt.

Referring to FIGS. 2 and 3, the exploded perspective view and assembly view of the present invention are illustrated. A device for forming a heat dissipating fin set is provided in the present invention. The device includes a heat tube 1, a heat dissipating fin set 2, and a metal wire 5. The heat tube 1 is made of copper. The interior of the heat tube 1 is installed with proper wick structure and working fluid (not shown). By the capillary function of the wick structure, the working fluid in the heat tube 1 can be transferred easily. The heat dissipating fin set 2 is made of copper. Each of the fin in the heat dissipating fin set 2 is formed with a though hole 3. The inner diameter of the though hole 3 is slightly larger than the outer diameter of the heat tube 1. An annular combining portion 4 extends from the edge of the though hole 3. The combining portion 4 protrudes from one side of the heat dissipating fin set 2. The upper edge of the though hole 3 is installed with a slender hole 6. The slender hole 6 serves to be inserted by the metal wire 5. The size of the slender hole 6 is dependent on the quantity of the metal wire 5. The heat dissipating fin set 2 is engaged to the heat tube 1 by the engagement of the though hole 3 and the combining portion 4. The metal wire 5 is placed into the slender hole 6 at the upper edge of the though hole 3 of the heat dissipating fin set 2. By heat melting, the heat dissipating fin set 2 and the heat tube 1 is combined as an integral heat dissipating device.

Figure 5:
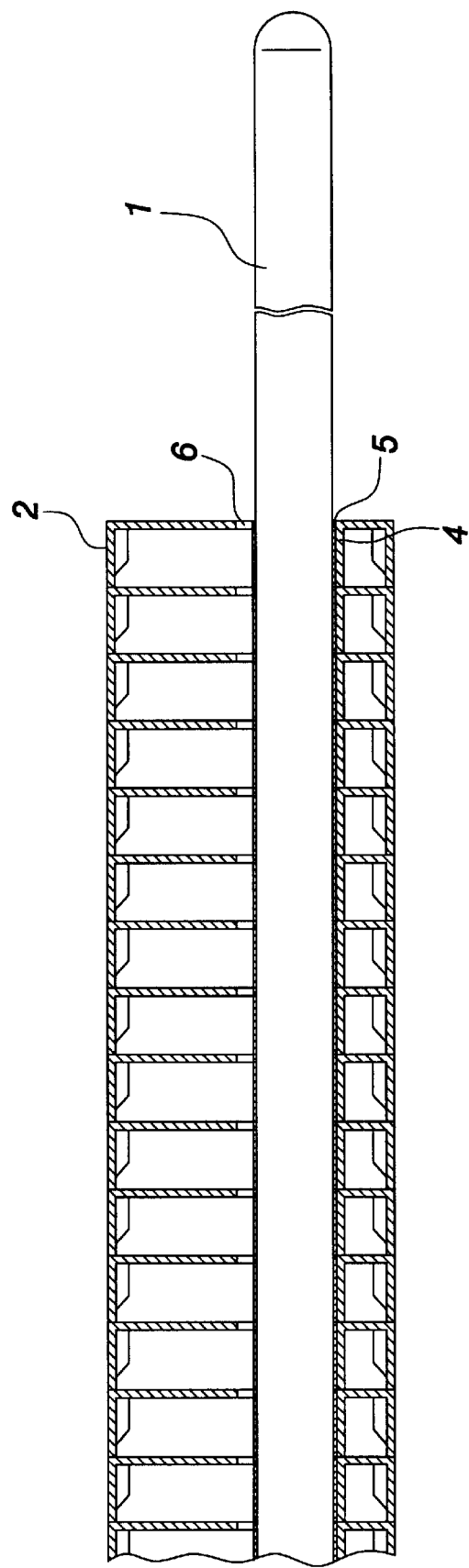
FIG. 5 is a cross section view of the present invention.

With reference to FIG. 5, a cross sectional view of the present invention is illustrated. It is shown that the melt metal wire 5 tightly connects the heat dissipating fin set 2 with the heat tube 1 so that a device for forming a heat dissipating fin set with a heat resistor without any interface and having a preferred heat conductance is formed.

In using the present invention, one end of the heat tube 1 is connected to a heat conductive block (not shown). The heat conductive block is combined with the heat tube 1 by sintering. Then the heat conductive block is adhered to a central processing unit (CPU) or a heat temperature tolerable chip, etc. Thereby the heat tube 1 can be used to guide the heat of a heat emitting element. Furthermore, the heat dissipating fin set 2 is used to increase the heat dissipating area so as to have a preferred heat dissipating effect.

In the present invention, the heat tube 1 and heat dissipating fin set 2 are made of copper which has good extension ability and heat conductance. The extension ability and heat conductance of copper are better than those of aluminum.

Furthermore, the heat resistance of copper is better than aluminum. The heat tube 1 and heat dissipating fin set 2 are formed integrally by melting silver, tin or copper. This combination way is better than the prior art in that the heat dissipating fin set 2 is firmly secured to the heat tube 1. In the present invention, the heat tube 1 is almost completely engaged to and heat dissipating fin set 2. Moreover, in the present invention, the heat dissipating fin set 2 and heat tube 1 are not glued together through heat conductive glue. It has no heat resistance and thus has a preferred heat conductance.

Therefore, by the present invention, the defects of the prior art, such as bad sealing between the heat dissipating fin set and the heat tube, high heat resistance in the interface, low heat conductance, are improved.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A device for forming a heat dissipating fin set comprising:

a heat tube made of copper, and at least one heat dissipating fin set made of metal, each fin in the heat dissipating fin set having a though hole; one side of the though hole being extended with a combining portion; a slender hole with a smaller diameter being formed on an upper edge of the though hole; the heat dissipating fin set being engaged to the heat tube through the though holes; and a metal wire being arranged into the slender holes at an upper edge of fin in the heat dissipating fin set; and then the heat tube and heat dissipating fin set being combined by heat melting.

2. The device for forming a heat dissipating fin set as claimed in claim 1, wherein the metal wire is selected from the group consisting of silver, tin and copper.

3. The device for forming a heat dissipating fin set as claimed in claim 1, wherein the slender hole at an upper edge of the though hole of the fin has a size depending on a diameter of the heat tube.

\* \* \* \* \*